United States Patent [19]

Itoh et al.

[11] Patent Number: 4,993,053
[45] Date of Patent: Feb. 12, 1991

[54] CHARGE TRANSFER DEVICE PROVIDED WITH AN IMPROVED OUTPUT STAGE

[75] Inventors: Hiroaki Itoh; Kazuo Miwada, both of Tokyo, Japan

[73] Assignee: NEC Corporation, Japan

[21] Appl. No.: 287,835

[22] Filed: Dec. 21, 1988

[30] Foreign Application Priority Data

Dec. 22, 1987 [JP] Japan .................................. 62-326178

[51] Int. Cl.$^5$ ...................... G11C 19/28; H01L 29/78
[52] U.S. Cl. .......................................... 377/60; 357/24
[58] Field of Search ...................... 357/24; 377/57–63

[56] References Cited

U.S. PATENT DOCUMENTS

| | | | |
|---|---|---|---|
| 3,903,543 | 9/1975 | Smith | 357/24 |
| 4,124,861 | 11/1978 | Baertsch et al. | 357/24 |
| 4,124,862 | 11/1978 | Engeler et al. | 357/24 |
| 4,377,755 | 3/1983 | Jensen | 357/24 |
| 4,499,590 | 2/1985 | Bluzer | 377/60 |
| 4,598,414 | 7/1986 | Dries et al. | 377/60 |

Primary Examiner—Gene M. Munson
Attorney, Agent, or Firm—Laff, Whitesel, Conte & Saret

[57] ABSTRACT

There is disclosed a charge transfer device including a semiconductor substrate, a charge transfer section formed on the semiconductor substrate for transferring charges, at least two regions formed in the semiconductor substrate via a PN-junction, one of said regions receiving the charges transferred through the charge transfer section and connected to an output terminal and at least one gate electrode formed on the semiconductor substrate between the regions via an insulator film to form a MOS transistor switch which is switched for controlling the sensitivity of the output stage and the dynamic range of the output signal.

4 Claims, 5 Drawing Sheets

CHARGE TRANSFER DEVICE PROVIDED WITH AN IMPROVED OUTPUT STAGE

BACKGROUND OF THE INVENTION

1. Field of the Invention:

The present invention relates to a charge transfer device and, particularly, to an improvement of an output stage thereof.

2. Description of the Related Art:

The output of a charge transfer device is taken out through an output stage which converts the value of electric charge into a voltage. FIGS. 1(a) and 1(b) are a plan view of a conventional output stage of the charge transfer device and a sectional view along the line D—D' thereof, and FIGS. 1(c), 1(d) and 1(e) are diagrams of potentials for illustrating the operation of the output stage. To simplify the description, here, the charge transfer device is a surface channel-type charge coupled device, the substrate is a p-type semiconductor substrate, and the carriers to be transferred are electrons. In the drawings, reference numeral 1 denotes a p-type silicon substrate, 2 denotes an insulating film, 3 denotes a transfer channel, reference numerals 4 to 7 denote transfer electrodes composed of a conductor such as polycrystalline silicon or the like, 8 denotes an output gate electrode, 403 denotes a reset gate electrode, and reference numerals 401 and 402 denote an n-type source region and an n-type drain region. A MOS transistor $Tr_1$ is constituted of 401, 402 and 403. Usually, the charge-to-voltage conversion and the impedance conversion take place in an arrangement composed of the diffused region (floating diffusion layer) 401, an output-stage transistor $Tr_2$ and a resistor R, and the output appears at a terminal $V_{OUT}$. Reference numerals 9 and 10 denote diffusion layers for determining the direction of transfer of electric charge.

Next, operation of the conventional output stage will be described in conjunction with FIGS. 1(c), 1(d) and 1(e). Potentials under the transfer electrodes are changed by changing the clock pulses $\phi_1$ and $\phi_2$ to transfer the signal charge toward the right in the drawings. At the same time, a reset pulse $\phi_R$ having a "high" (active) level is produced so that the MOS transistor $Tr_1$ is turned on. Then, the potential of the floating diffusion layer 401 is reset to be the same as the drain voltage $V_{RD}$ of the MOS transistor $Tr_1$ (FIG. 1(c)). Next, in order to detect a signal, the reset pulse $\phi_R$ having "low" level is produced to turn the MOS transistor $Tr_1$ off, so that a potential barrier is formed under the gate electrode 403 (FIG. 1(c)). Thereafter, the clock pulse $\phi_1$ having the "low" level is produced, and the signal charge stored under the transfer electrode 7 is permitted to flow into the floating diffusion layer 401 through a transfer channel under the output gate electrode 8 to which a predetermined constant voltage $V_{OG}$ is applied (FIG. 1(e)).

Here, the charge-to-voltage conversion is effected by the electrostatic capacity of the floating diffusion layer 401 with respect to the substrate 1, by the capacity of the wiring connected to the floating diffusion layer 401 and by the electrostatic capacity with respect to the gate electrode, the impedance conversion is effected by a source follower circuit consisting of the MOS transistor $Tr_2$ and the resistor R, and the output voltage is obtained from the output terminal $V_{OUT}$.

A potential change $\Delta V_{SO}$ in the floating diffusion layer 401 due to the flow of electric charge is given by, $$\Delta V_{SO} = \frac{Q}{C_0} \quad (1)$$

where Q is the amount of input electric charge, and $C_0$ is the sum of electrostatic capacity of the floating diffusion layer 401 relative to the substrate 1, electrostatic capacity relative to the gate electrode, and capacity of the wiring connected to the source region 301.

However, the output stage of the above-mentioned conventional charge transfer device involves defects as described below.

That is, when the electric charge that flows into the floating diffusion layer 401 becomes greater than the height $V_{SAT}$ of the potential barrier of when the reset pulse $\phi_R$ has the "low" level as shown in FIGS. 2(a) and 2(b), the electric charge flows into the drain region 402 through a transfer channel under the gate electrode 403. Therefore, the potential change does not increase due to the potential barrier $V_{SAT}$ but is limited by the barrier $V_{SAT}$. As shown in FIG. 3, therefore, if it is attempted to increase the sensitivity of the output stage by decreasing the electrostatic capacity $C_O$, the dynamic range is narrowed. Conversely, if it is attempted to broaden the dynamic range by increasing the electrostatic capacity $C_0$, the sensitivity decreases.

SUMMARY OF THE INVENTION

It is a primary object of the present invention to provide a charge transfer device having a charge transfer section and an output stage receiving charges from the charge transfer section for converting the received charges into a voltage form output, the output stage being highly sensitive in a case where the quantity of the received charges are small and producing an output signal having a large dynamic range in a case where the quantity of the received charges is large.

There is provided a charge transfer device including a charge transfer section having semiconductor substrate, a channel region in the semiconductor substrate and a plurality of transfer electrodes formed on the channel region through an insulator film for transferring charges through the channel region, and an output stage formed in the semiconductor substrate to receive the charges transferred through the channel, the output stage having a plurality of regions forming a capacitor with the semiconductor substrate, one of the regions being coupled to the charge transfer section and an output terminal and the other of the regions being coupled to the one region through at least one switch to change the total capacitance of region or regions which receives the transferred charges. The regions may be formed of ones having a conductivity type opposite to the semiconductor substrate. The switches may be formed of MOS FET's having a gate electrode formed on a portion between adjacent two of the regions through an insulator film.

According to the present invention, if the quantity of charges transferred through the channel region to the output stage, a large output voltage can be produced from the output stage by decreasing the area of the region coupled to the charge transfer section by opening the switches. That is, the output stage becomes sensitive. On the other hand, if the quantity of charges transferred through the channel region to the output stage, an output signal having a large dynamic range can be obtained by increasing the area of the region coupled to the charge transfer section by closing the switches. The sensitivity and the value of dynamic range can be controlled by adjusting the area of the regions coupled to the charge transfer section by way of controlling the number of switches which are closed or opened. In other words, an adequate output signal can be always obtained, irrespective of the quantity of charges transferred through the channel region, by controlling the number of switches which are closed or opened.

BRIEF DESCRIPTION OF THE DRAWINGS

The above and further objects, features and advantages of the present invention will become more apparent from the following detailed description taken in conjunction with the accompanying drawings, wherein.

DETAILED DESCRIPTION OF THE EMBODIMENTS

The invention will now be described in conjunction with the drawings.

Figure 1:
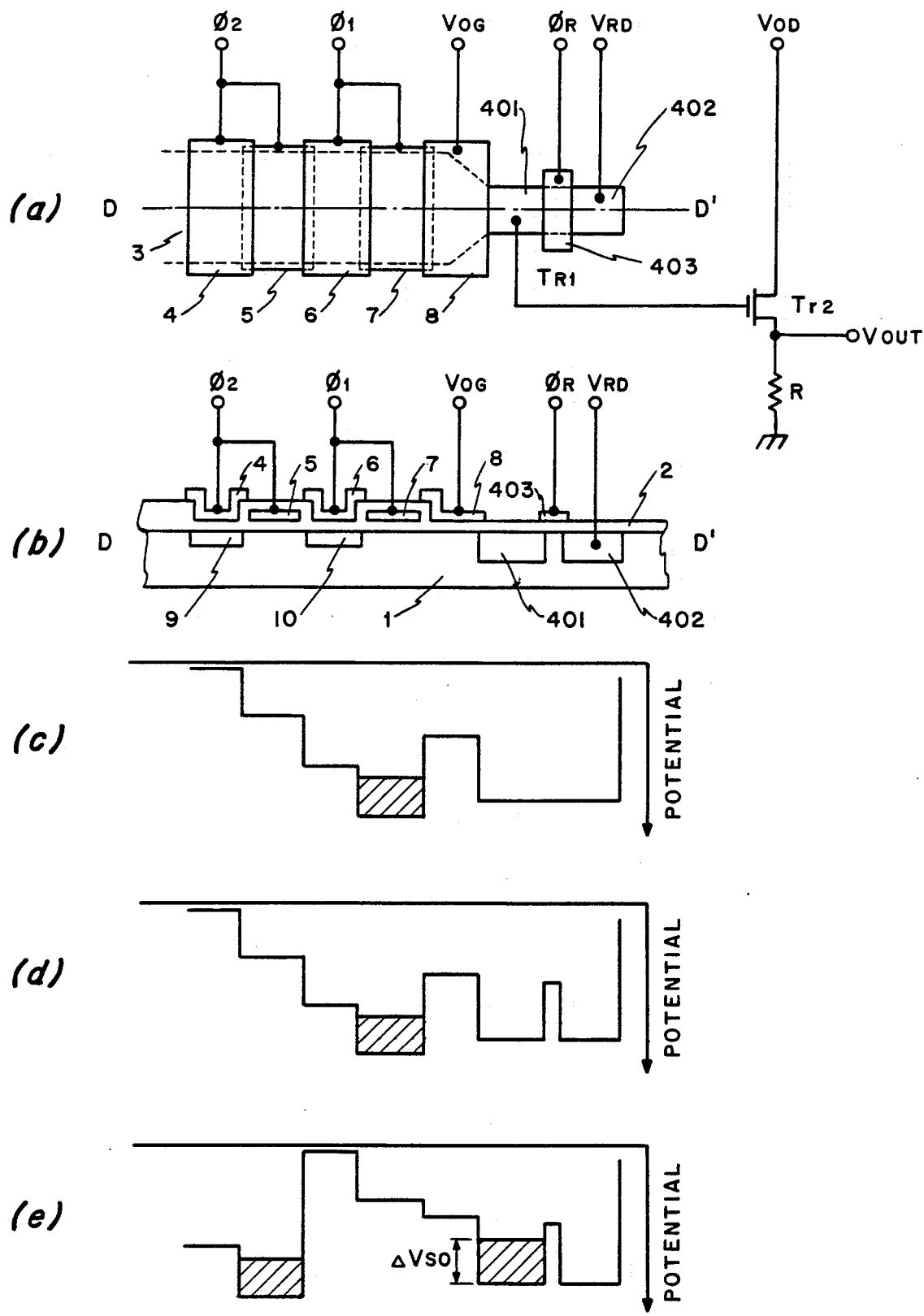
FIG. 1(a) is a plan view of the charge transfer device in the prior art.
FIG. 1(b) is a sectional view taken along the line D—D' of FIG. 1(a), and FIGS. 1(c) to 1(e) are potential profiles showing the operation of the output stage in the charge transfer device of FIGS. 1(a) and 1(b)
Figure 2:
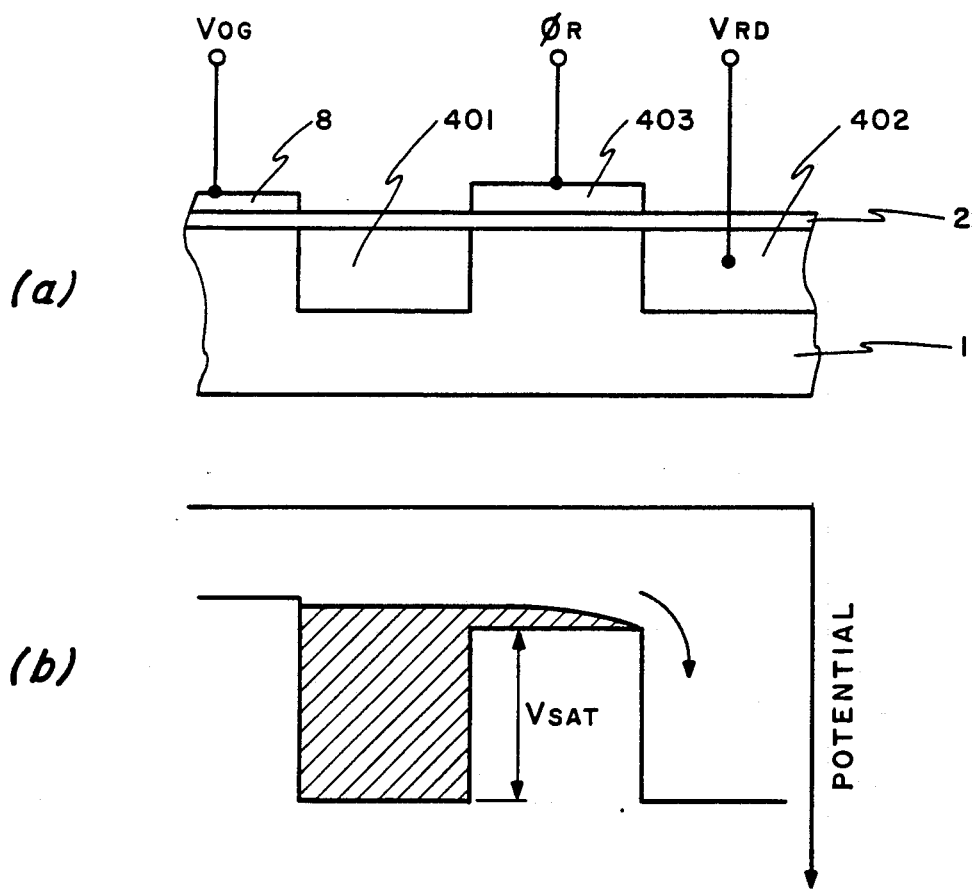
FIGS. 2(a) and 2(b) are a sectional view of the output stage of the charge transfer device shown in FIGS. 1(a) and 1(b) and a potential profile showing the resetting operation thereof.
Figure 3:
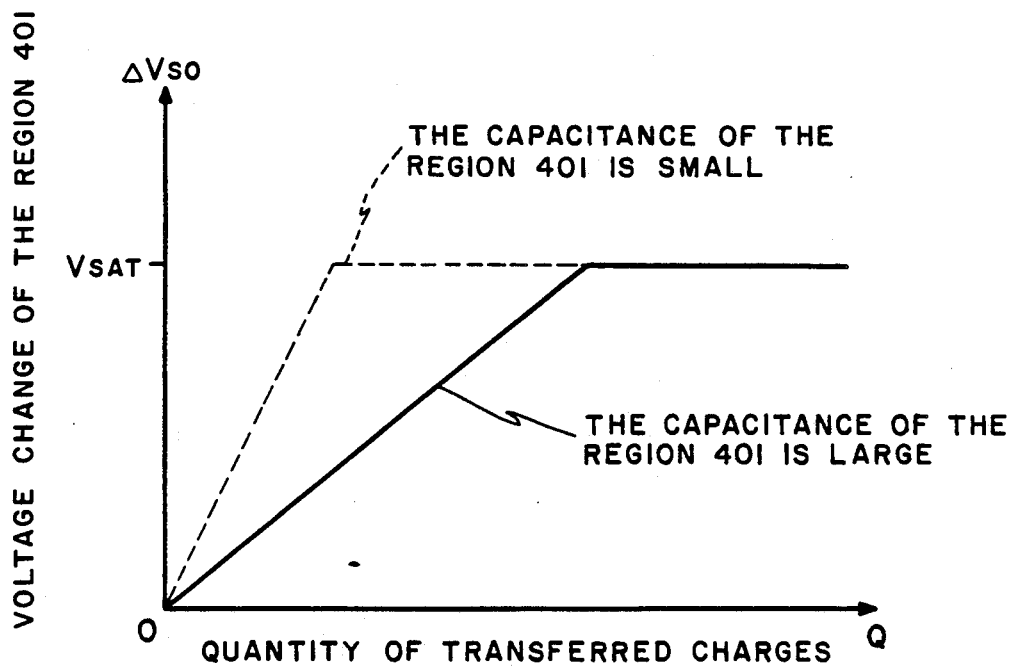
FIG. 3 shows a graph expressing the relationships between the potential change in a floating diffusion region 401 of FIGS. 1(a) and 1(b) and the quantity of charges supplied into the floating diffusion region 401 from the charge transfer section.
Figure 4:
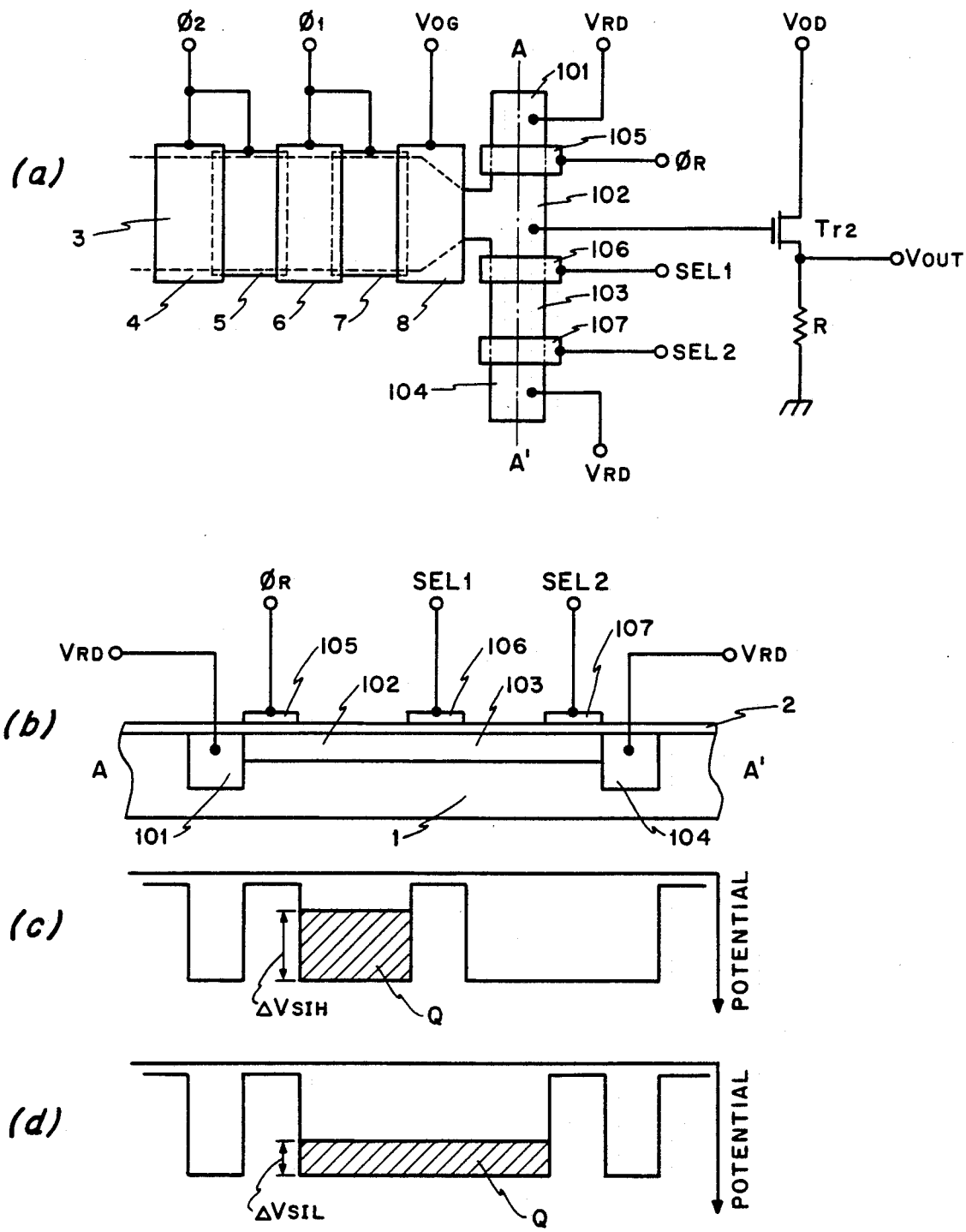
FIG. 4(a) is a plan view of the charge transfer device according to the first embodiment of the present invention.
FIG. 4(b) is a sectional view of the output stage taken along the line A—A' of FIG. 4(a), and FIGS. 4(c) and 4(d) are potential profiles showing the operation of the output stage of FIGS. 4(a) and 4(b)

FIGS. 4(a) to 4(d) illustrate a first embodiment of the present invention, wherein FIGS. 4(a) and 4(b) are a plan view of the charge transfer device including a charge transfer section and an output stage and a sectional view along the line A—A' thereof, and FIGS. 4(c) and 4(d) are potential profiles under the line A—A'. In these drawings, reference numeral 1 denotes a p-type silicon substrate, 2 denotes an insulating film such as $SiO_2$, 3 denotes a transfer channel, reference numerals 4 to 7 denote transfer electrodes made of a conducting material such as polycrystalline silicon, aluminum or the like, 8 denotes an output gate electrode, 101 to 104 denote n-type regions, 105 denotes a reset gate electrode, and reference numerals 106 and 107 denote gate electrodes for changing the sensitivity of the output stage. The gate electrode 106 and 107 for changing the sensitivity are served with switching control signals SEL1 and SEL2 as will be described later. To the floating diffusion layer 102 is connected with the gate of the transistor $Tr_2$, and the output voltage is taken out from an output terminal $V_{OUT}$ at a connection point between the source terminal and the resistor. R with the transistor $Tr_2$ as a source follower.

The transfer channel 3 is formed at the surface of the substrate 1 with N-type. Every other transfer electrodes 5, 7 are formed on the transfer channel 3 through the insulating film 2 with polycrystalline silicon. After the surface of the transfer electrodes 5, 7 are covered with $SiO_2$ by thermal oxidation, the remaining transfer electrodes 4, 6 and the output gate electrode 8 are formed on the insulating film 2 with overlap over the surface $SiO_2$ of the transfer electrodes 5, 7 to form a charge transfer section. Clock pulses $\phi_1$ and $\phi_2$ are respectively applied to every other pairs of transfer electrodes 6 and 7 and to the remaining pairs of transfer electrodes 4 and 5. A constant voltage $V_{OG}$ is applied to the output gate electrode 8 to prevent charges from flowing back to the transfer channel 3 from the output stage.

The output stage has n-type regions 101 and 104 and a n-type region therebetween. The n-type region between the n-type regions 101 and 104 is formed continuous but includes regions 102 and 103. The reset electrode 105 is formed on the insulating film 2 between the regions 101 and 102. The gate electrodes 106 and 107 are respectively formed on the insulating film 2 between the regions 102 and 103 and between the regions 103 and 104 to form FET switches. A constant reset voltage $V_{RD}$ is applied to the regions 101 and 104 for resetting charges in the regions 102 and 103. The region 102 is connected to the gate of a MOS FET $Tr_2$ having a drain held at a voltage $V_{OD}$ and a source grounded through a load resistor R and connected to the output terminal $V_{Out}$ for converting quantity of charges into a voltage form signal.

Next, the operation of the output stage will be described with reference to FIGS. 4(b) to 4(d). a reset pulse $\phi_R$ is applied at the time of reset and, at the same time, switching signals SEL1 and SEL2 are applied, whereby a first MOS transistor switch is turned on with the reset pulse $\phi_R$ as a gate signal, and the second and third MOS transistor switches are turned on with the switching signals SEL1 and SEL2 as gate signals, so that charges of the floating diffusion regions 102 and 103 are reset.

In order to obtain a high sensitivity under the operation condition, the switching signal SEL1 for changing the sensitivity is set to the "low" level as shown in FIG. 4(c), and the signal charge transferred via the transfer electrodes 4 to 7 and the output electrode 8 is stored in the floating diffusion region 102 only. At this moment, the signal SEL2 is set to the "high" level to turn the third MOS transistor switch on, and the potential at the floating diffusion region 103 is set to become the same as $V_{RD}$, in order to prevent the floating diffusion region 103 from being accumulated with the electric charge due to dark current, to prevent the floating diffusion region 102 from being flooded with the electric charge, and to prevent the flooded electric charge from mixing into the signal charge when the sensitivity is switched to a low value. A potential change $\Delta V_{SIH}$ in the floating diffusion region 102 due to the signal charge Q when the sensitivity is high is given by, $$\Delta V_{SIH} = \frac{Q}{C_{102}} \quad (2)$$

where $C_{102}$ denotes the sum of electrostatic capacity of the floating diffusion region 102 with respect to the substrate 1, electrostatic capacity with respect to the neighboring gate, and electrostatic capacity of the wiring connected to the floating diffusion region 102.

When the sensitivity is low, the sensitivity switching signal SEL1 is set to the "high" level as shown in FIG. 4(d), and the second MOS transistor switch is turned on to render the floating diffusion regions 102 and 103 to become conductive. At this moment, the sensitivity switching signal SEL2 is set to the "low" level. A potential change 66 $V_{SIL}$ in the floating diffusion regions 102 and 103 due to the flow of electric charge Q is given by, $$\Delta V_{SIL} = \frac{Q}{C_{102} + C_{103}} \quad (3)$$

where $C_{102}$ has the same meaning as described above, and $C_{103}$ denotes the sum of electrostatic capacity of the floating diffusion region 103 with respect to the substrate 1 and electrostatic capacity with respect to the neighboring gate.

As described above, the capacity of the floating diffusion region that effects the charge-to-voltage conversion is substantially changed in response to the sensitivity switching signals SEL1 and SEL2, such that a high sensitivity is maintained even when the electric charge flows in small amounts and that a broad dynamic range is maintained by lowering the sensitivity when the electric charge flows in large amounts.

Figure 5:
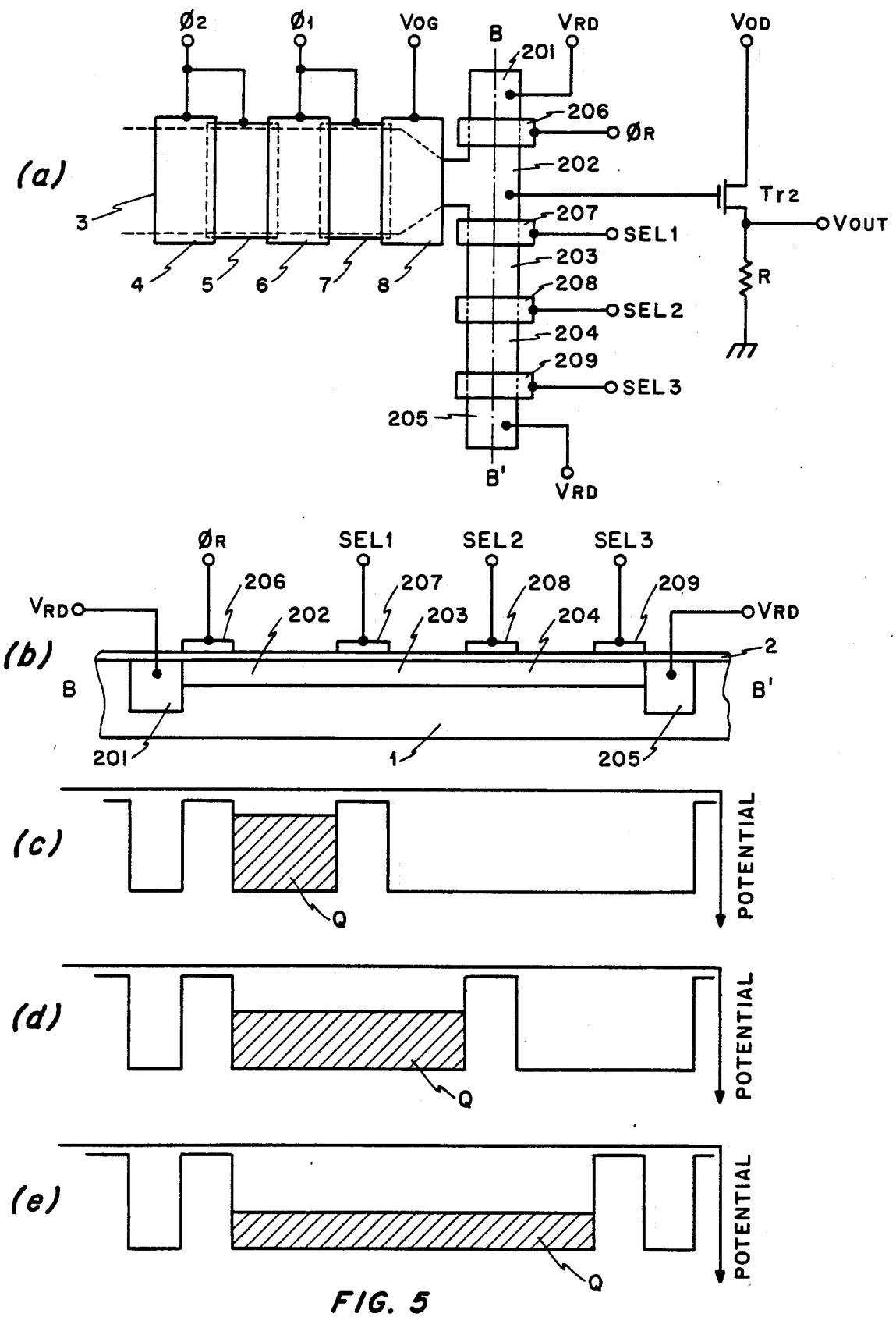
FIG. 5(a) is a plan view of the charge transfer device according to the second embodiment of the present invention.
FIG. 5(b) is a sectional view of the output stage taken along the line B—B' of FIG. 5(a), and FIGS. 5(c) to 5(e) are potential profiles showing the operation of the output stage of FIGS. 5(a) and 5(b)

FIGS. 5(a) to 5(e) illustrate a second embodiment of the present invention, wherein FIGS. 5(a) and 5(b) are a plan view of the output device and a sectional view along the line B—B' thereof, and FIGS. 5(c), 5(d) and 5(e) are potential profiles under the line B—B', In these drawings, the same portions as those of FIGS. 4(a) to 4(d) are denoted by the same reference numerals. Reference numerals 201 to 205 denote n-type regions for changing the capacitance, 206 denote a reset gate electrode, and 207 to 209 denote gate electrodes for changing the sensitivity. In this embodiment, the second floating diffusion region 203 is connected to the first floating diffusion region 202 via the first gate electrode 207, and the third floating diffusion region 204 is connected to the second floating diffusion region 202 via the second gate electrode 208. Here, the third floating diffusion region 204 is connected to the power source $V_{RD}$ via the third gate electrode 209.

When the sensitivity is high, the signal SEL1 is set to the "low" level to store the signal charge in the floating diffusion region 202. In this case, the signals SEL2 and SEL3 have the "high" level, and potentials of the floating diffusion regions 203 and 204 are set to $V_{RD}$.

When the sensitivity is intermediate, the signal SEL2 is set to the "low" level and the signal SEL1 is set to the "high" level to store the signal charge in the floating diffusion regions 202 and 203. In this case, the signal SEL3 is set to the "high" level and the potential of the floating diffusion region 204 is set to $V_{RD}$.

When the sensitivity is low, the signals SEL1 and SEL2 are set to the "high" level and the signal SEL3 is set to the "low" level to store the signal charge in the floating diffusion regions 202, 203 and 204.

In this second embodiment, the first, second and third floating diffusion regions 202, 203 and 204 are connected in series via gate electrodes 207 and 208, and potentials of the gate electrodes 207 and 208 are changed to vary the sensitivity in three different ways.

Figure 6:
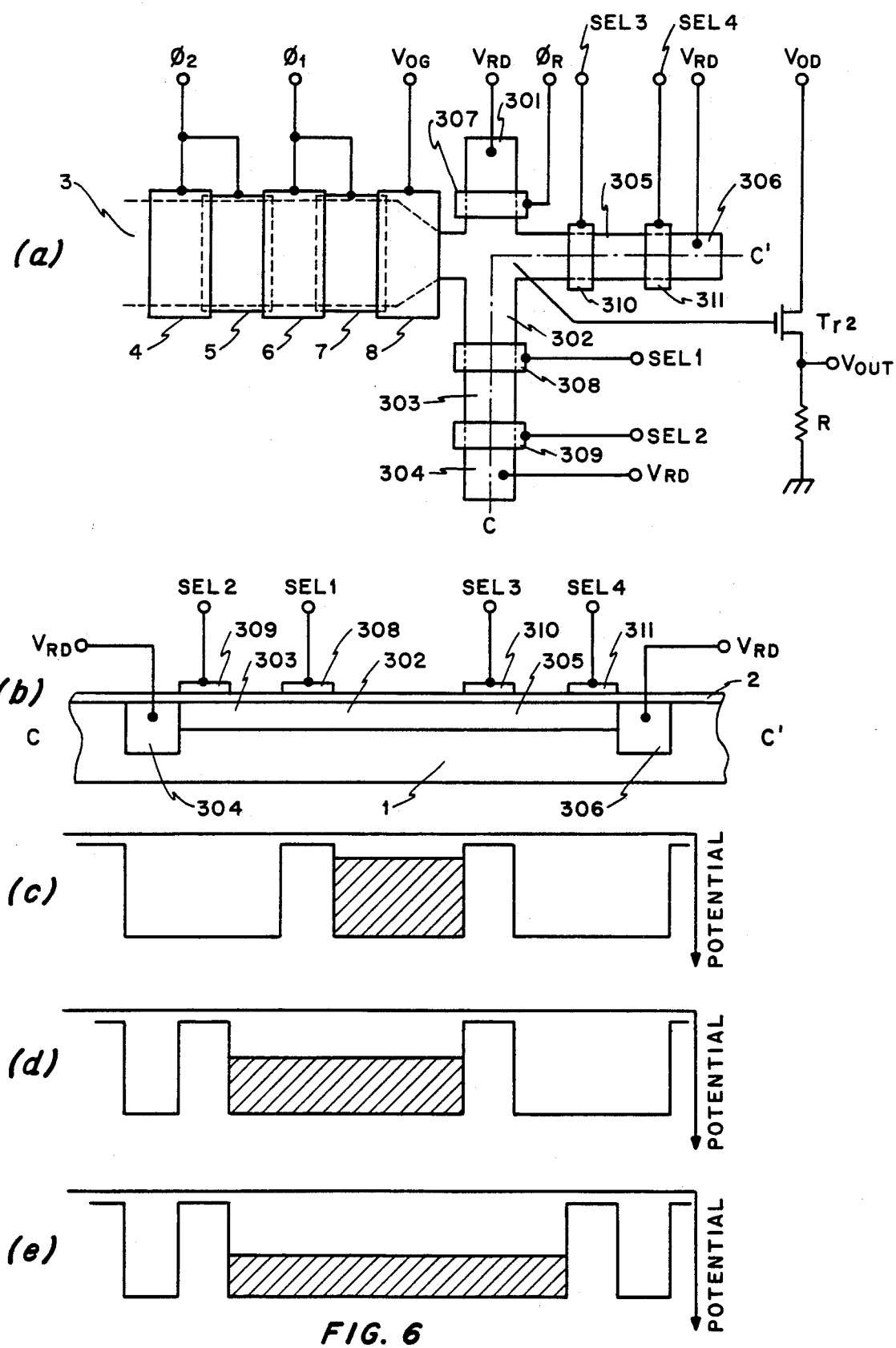
FIG. 6(a) is a plan view of the charge transfer device according to the third embodiment of the present invention.
FIG. 6(b) is a sectional view of the output stage taken along the line C—C'.
FIGS. 6(c) to 6(e) are potential profiles showing the operation of the output stage of FIGS. 6(a) and 6(b).

FIGS. 6(a) to 6(e) show a third embodiment of the present invention, wherein FIGS. 6(a) and 6(b) are a plan view of the output device and a sectional view along the line C—C' thereof, and FIGS. 6(c), 6(d) and 6(e) are potential profiles under the line C—C'. In the drawings, the portions same as those of FIGS. 4(a) to 4(d) are denoted by the same reference numerals. Reference numerals 301 to 306 denote n-type diffusion regions, 307 denote a reset gate electrode, and 308 to 311 denote gate electrodes for changing the sensitivity.

In this embodiment, the second floating diffusion region 303 and the third floating diffusion region 305 are connected to the first floating diffusion region 302 via the first gate electrode 308 and the second gate electrode 310.

When the sensitivity is high, the signals SEL1 and SEL3 are set to the "low" level to store the signal charge in the floating diffusion region 302. At this moment, the signals SEL2 and SEL4 are set to the "high" level, and the floating diffusion regions 303 and 305 are set to the same potential as $V_{RD}$ (FIG. 6(c)).

When the sensitivity is intermediate, the signals SEL2 and SEL3 are set to the "low" level, the signal SEL1 is set to the "high" level, and the signal charge is stored in the floating diffusion regions 302 and 303 (FIG. 6(d)). Or, the signals SEL1 and SEL4 are set to the "low" level, and the signal SEL3 is set to the "high" level to store the signal charge in the floating diffusion regions 302 and 305. In these cases, the sensitivity is not the same when the floating diffusion region 305 and the floating diffusion region 303 have the same capacity, and the sensitivity can be further differed when the capacities are not the same.

When the sensitivity is low, the signals SEL2 and SEL4 are set to the "low" level and the signals SEL1 and SEL3 are set to the "high" level to store the signal charge in the floating diffusion regions 302, 303 and 305.

According to this embodiment as described above, the second and third floating diffusion regions are connected to the first floating diffusion region via the first and second gate electrodes, respectively, and the sensitivity can be changed in three to four different ways by changing the potentials of gate electrodes.

According to the present invention as described above, capacities of the floating diffusion regions for converting the electric charge into a voltage in the output stage are changed to increase the sensitivity when the electric charge flows in small amounts and, conversely, to decrease the sensitivity in order to broaden the dynamic range when the electric charge flows in large amounts in which high sensitivity is not required.

The foregoing description has dealt with the surface channel-type charge transfer device. However, it needs not to be pointed out that the present invention can also be adapted to even the charge transfer device in which part or all of the portions of the device are comprised of buried channels. Moreover, the semiconductor substrate needs not necessarily be limited to that of the p-type only but may be the one of the n-type provided polarities of the conductivity types are reversed and positive and negative polarities of potentials are reversed.

What is claimed is:

1. A charge transfer device comprising:
   a semiconductor substrate of one conductivity type;
   a charge transfer section formed on said semiconductor substrate for transferring charges in a direction;
   a first region formed in said semiconductor substrate with the other conductivity type to receive said charges transferred through said charge transfer section;
   a second region formed in said semiconductor substrate with said other conductivity type in a region adjacent to said first region;
   a first gate electrode formed on said semiconductor substrate between said first and second regions via an insulator film to form a switch for controlling the connection between said first and second regions; and
   means for deriving an output signal from said first region, said means including a MOS transistor having a gate connected to said first region, a drain, and a source; a resistive load element coupled between said source of said MOS transistor and a circuit point which is held at a reference potential; and an output terminal coupled to said source of said MOS transistor.

2. A charge transfer device as claimed in claim 1, said charge transfer device further comprising a third region formed in said semiconductor substrate with said other conductivity type in a region adjacent to said first region, a means for applying a constant voltage to said third region, and a second gate electrode formed on said semiconductor substrate between said first and third regions via another insulator film.

3. A charge transfer device as claimed in claim 2, said charge transfer device further comprising a fourth region formed in said semiconductor substrate with said other conductivity type in a region adjacent to said second region, a means for applying said constant voltage to said fourth region, and a third gate electrode formed on said semiconductor substrate between said second and fourth regions via still another insulator film.

4. A charge transfer device comprising:
   a semiconductor substrate of one conductivity type; a charge transfer section formed on said semiconductor substrate for transferring charges in a direction;
   a first region formed in said semiconductor substrate with the other conductivity type to receive said charge transferred through said charge transfer section;
   a second region formed in said semiconductor substrate with said other conductivity type in a region adjacent to said first region;
   a first gate electrode formed on said semiconductor substrate between said first and second regions via an insulator film to form a switch for controlling the connection between said first and second regions;
   means for deriving an output signal from said first region
   a third region formed in said semiconductor substrate with said other conductivity type in a region adjacent to said second region;
   means for applying for a constant voltage to said third region; and
   a second gate electrode formed on said semiconductor substrate between said second and third regions via another insulator film to control the electrical connection between said second and third regions for making the electrical potential at said second region the same value as the electrical potential at said third region when said second region is separated from said first region by said first gate electrode.

* * * * *